United States Patent [19]
Milton et al.

[11] Patent Number: 6,075,415
[45] Date of Patent: Jun. 13, 2000

[54] DIGITAL FREQUENCY MULTIPLIER

[75] Inventors: David W. Milton, Underhill; Marc R. Turcotte, Jericho; Charles B. Winn, Colchester, all of Vt.

[73] Assignee: International Business Machines Corporation, Armonk, N.Y.

[21] Appl. No.: 09/224,761

[22] Filed: Jan. 4, 1999

[51] Int. Cl.[7] .................................................. H03L 7/099
[52] U.S. Cl. ........................... 331/25; 327/116; 327/119; 331/27; 331/34; 331/57
[58] Field of Search .................................. 331/25, 27, 34, 331/57; 327/116, 119

[56] References Cited

U.S. PATENT DOCUMENTS

| | | | |
|---|---|---|---|
| 3,970,954 | 7/1976 | Even | 331/53 |
| 5,146,121 | 9/1992 | Searles et al. | 307/603 |
| 5,245,231 | 9/1993 | Kocis et al. | 307/606 |
| 5,438,300 | 8/1995 | Saban et al. | 331/16 |
| 5,592,515 | 1/1997 | Saban et al. | 375/340 |
| 5,764,111 | 6/1998 | Bushman | 331/57 |
| 5,786,715 | 7/1998 | Halepete | 327/116 |

*Primary Examiner*—Siegfried H. Grimm
*Attorney, Agent, or Firm*—Dugan & Dugan; Eugene I. Shkurko

[57] ABSTRACT

A digital frequency multiplier is provided that continues to adjust its multiplied frequency after the desired multiplied frequency is reached, that can be tested during operation and that is easily scalable. The digital frequency multiplier comprises a frequency detector, a frequency adjuster and a ring oscillator (RO). The frequency detector is configured for receiving a reference frequency and an RO output frequency, and for continuously monitoring a difference between the reference frequency and the RO output frequency. Based on the continuously monitored difference, the frequency detector continuously outputs an adjusting signal to the frequency adjuster. In response thereto, the frequency adjuster outputs selection data to the RO that adjusts the oscillation frequency of the RO, and thus the multiplied frequency of the digital frequency multiplier. Testable and growable logic circuitry are provided within the RO that allow the digital frequency multiplier to be tested during operation and easily scaled.

23 Claims, 4 Drawing Sheets

DIGITAL FREQUENCY MULTIPLIER

FIELD OF THE INVENTION

The present invention relates to frequency multipliers, and more specifically to an improved method and apparatus for digital frequency multiplication.

BACKGROUND OF THE INVENTION

There are many circumstances in which a signal's frequency must be multiplied. For instance, a clock signal's frequency is often multiplied numerous times within a computer system to accommodate the clocking requirements of the various components with the system (e.g., microprocessors, audio components, IR interfaces, etc.). Each required clock signal for each component is supplied from a common, relatively low frequency clock signal that is multiplied to the desired frequency.

In addition to supplying multiple clock signals, frequency multipliers typically are employed within microprocessors having operating frequencies above about 200 MHZ. Because a 200 MHZ or faster clock signal broadcasts if transmitted over a wire, a 50 MHZ external clock typically is employed to drive a high speed microprocessor. A frequency multiplier within the microprocessor multiplies the 50 MHZ clock signal to the required high frequency (e.g., 200–400 MHZ) and thus avoids broadcasting issues.

Digital frequency multipliers (DFMs) which digitally multiply signal frequency are known in the art. Conventional DFMs typically include a ring oscillator for generating the multiplied frequency from a reference frequency and a plurality of dividers that provide the required multiplication factor.

While capable of multiplying signal frequency, most conventional DFMs suffer from several drawbacks. For instance, DFMs typically tune a ring oscillator to the desired multiplied frequency and then "lock" the ring oscillator's oscillation frequency so as to prevent further adjustments to the oscillation frequency. Once locked, the DFM cannot compensate for drift (e.g., thermally induced) in the ring oscillator's oscillation frequency, and an erroneous multiplied frequency may result. Further, conventional DFMs are not easily testable, especially during operation, and generally are not readily scalable because the repowering circuitry required to drive additional logic gates within a conventional DFM affects the internal delays of the DFM's ring oscillator and thus the multiplicative properties of the DFM.

Accordingly, a need exists for a DFM that adjusts ring oscillator oscillation frequency even after the desired oscillation frequency is reached, that can be tested during operation and that is easily scalable.

SUMMARY OF THE INVENTION

To address the needs of the prior art, an inventive digital frequency multiplier is provided that continues to adjust its multiplied frequency after the desired multiplied frequency is reached, that can be tested during operation and that is easily scalable. The digital frequency multiplier comprises a frequency detector coupled (i.e., directly or indirectly so as to operate) to a frequency adjuster and to a ring oscillator (RO) having a plurality of selectable delay paths. The frequency detector is configured for receiving a reference frequency, a reference multiplier and a ring oscillator (RO) output frequency, and for continuously monitoring a difference between the reference frequency and the RO output frequency. Based on the continuously monitored difference, the frequency detector continuously outputs an adjusting signal to the frequency adjuster. The frequency adjuster receives the adjusting signal from the frequency detector, and in response thereto, outputs selection data to the RO.

In response to the selection data received from the frequency adjuster, the RO selects one of its delay paths and outputs an RO output frequency with a frequency dependent on the selected delay path.

The RO preferably comprises a coarse delay, a fine delay, LSSD gating, a bulk delay and steering logic. The coarse delay delays an RO signal traveling within the RO by a first delay. The fine delay, coupled to the coarse delay and to the frequency adjuster, receives the RO signal from the coarse delay and the selection data from the frequency adjuster, and delays the RO signal by a second delay determined by the selection data. The fine delay also outputs the RO signal (e.g., as the RO output frequency).

The LSSD gating is coupled to the fine delay and receives the RO signal. The LSSD gating has three modes of operation: a pass mode for passing the received RO signal, a test mode for storing the received RO signal and a reset mode for ignoring the received RO signal (e.g., so as to pre-load the RO during initialization of the digital frequency multiplier). The bulk delay is coupled to the LSSD gating, receives the RO signal therefrom and delays the RO signal by a third delay before outputting the RO signal to the steering logic.

The steering logic is coupled to the coarse delay, to the frequency adjuster and to the bulk delay. The steering logic receives the RO signal from the bulk delay, receives selection data from the frequency adjuster and adjusts the first delay of the coarse delay based on the received selection data. The steering logic preferably comprises a tree structure (e.g., an OR tree) that allows repowering circuitry to be added to the steering logic without increasing the RO signal's travel time through the steering logic.

Because the frequency detector continuously monitors the difference between the reference frequency and the RO output frequency, and continuously outputs an adjusting signal to the frequency adjuster, the inventive digital frequency multiplier continues to adjust its multiplied frequency (e.g., the RO output frequency) after the desired multiplied frequency is reached. Further, the LSSD gating within the RO allows testing of the digital frequency multiplier during its operation (e.g., in accordance with known LSSD techniques). The inventive digital frequency multiplier also is scaleable (e.g., due to the scaleable structure of the steering logic).

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
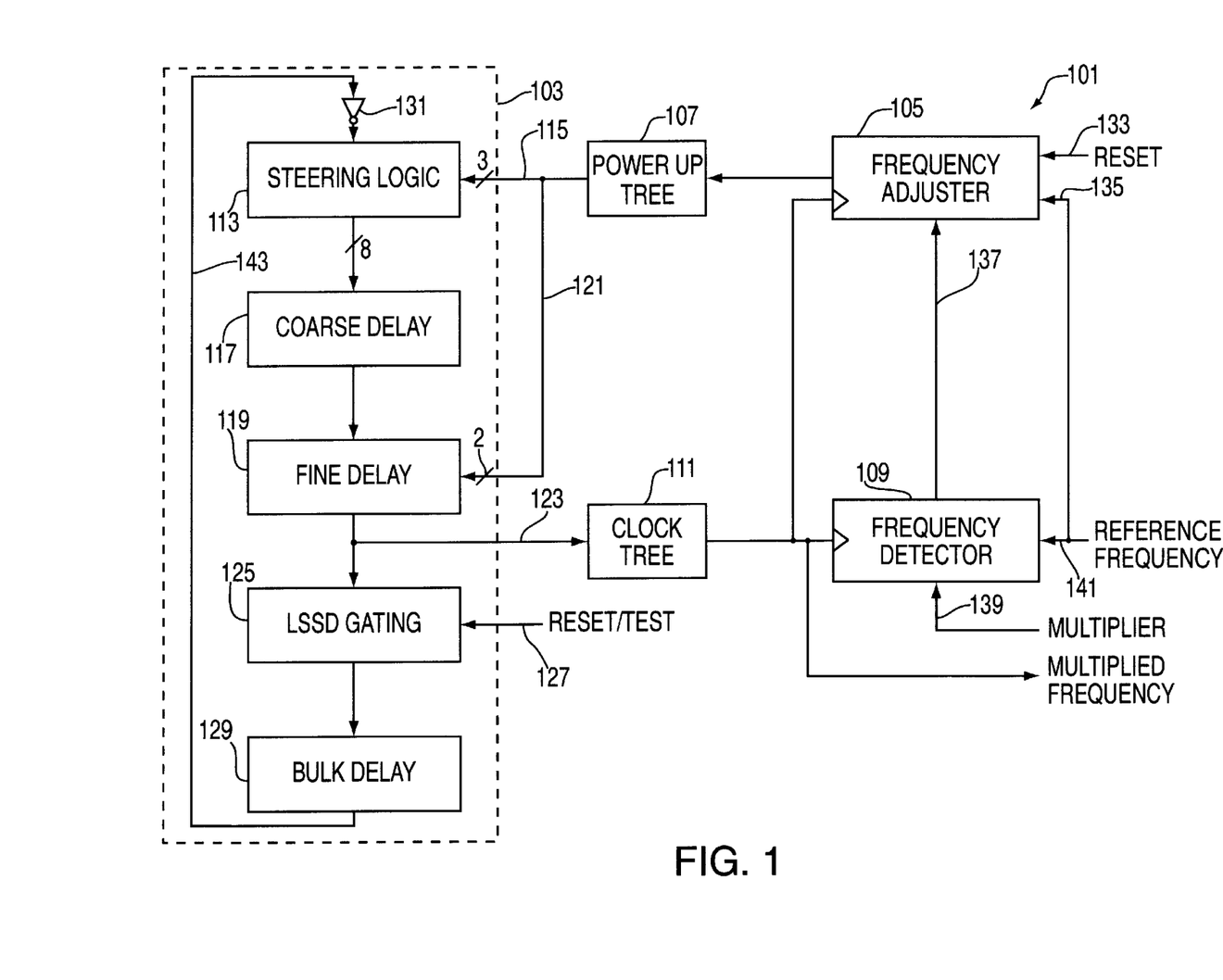
FIG. 1 is a block diagram of an inventive digital frequency multiplier configured in accordance with the present invention.

FIG. 1 is a block diagram of an inventive digital frequency multiplier 101 ("DFM 101") configured in accordance with the present invention. The DFM 101 comprises a ring oscillator 103 ("RO 103"), a frequency adjuster 105 coupled to the RO 103 via a power-up tree 107 and a frequency detector 109 coupled to the RO 103 via a clock tree 111 and coupled to the frequency adjuster 105.

The RO 103 comprises in pertinent part steering logic 113 coupled to an output of the frequency adjuster 105 via a first plurality of signal lines 115, a coarse delay 117 coupled to the steering logic 113, and a fine delay 119 coupled to the coarse delay 117, to the output of the frequency adjuster 105 via a second plurality of signal lines 121 and to both a clock input of the frequency adjuster 105 and a clock input of the frequency detector 109 via an RO output signal line 123. The RO 103 further comprises level sensitive scan design (LSSD) gating 125 coupled to the fine delay 119 and having a reset/test input terminal 127 for receiving a RESET/TEST signal (described below), and a bulk delay 129 coupled to the LSSD gating 125 and coupled to the steering logic 113 via an RO inverter 131. The RO inverter 131 may be part of the bulk delay 129 if desired.

The frequency adjuster 105 comprises a reset terminal 133 for receiving a RESET signal, a frequency adjuster reference frequency terminal 135 for receiving a reference frequency signal and an input terminal 137 for receiving an adjusting signal from the frequency detector 109. The frequency detector 109 comprises a multiplier terminal 139 for receiving a multiplier signal and a frequency detector reference frequency terminal 141 for receiving the reference frequency signal.

In general, the DFM 101 operates as follows. To generate a multiplied frequency from a reference frequency, the reference frequency and the desired multiplier for the reference frequency are supplied to the frequency detector 109 via the frequency detector reference frequency terminal 141 and the multiplier terminal 139, respectively. The frequency detector 109 and the frequency adjuster 105 thereafter induce the RO 103 to oscillate at the desired multiplied frequency (described below), and an RO signal is output from the RO 103 via the RO output signal line 123. The output RO signal serves as the multiplied frequency.

The frequency detector 109 compares the multiplied frequency output by the RO 103 to the reference frequency and determines if the multiplied frequency is the desired multiple of the reference frequency. Based on this comparison the frequency detector 109 outputs an adjusting signal to the frequency adjuster 105. The adjusting signal has a first value if the multiplied frequency is too low, a second value if the multiplied frequency is the proper frequency and a third value if the multiplied frequency is too high.

The frequency adjuster 105 receives the adjusting signal and outputs selection data to the steering logic 113 and to the fine delay 119 of the RO 103 via the first plurality of signal lines 115 and the second plurality of signal lines 121, respectively. The selection data causes the RO 103 to increase the frequency of the RO signal output by the RO 103 if the adjusting signal is the first value, to maintain the frequency of the RO signal if the adjusting signal is the second value and to decrease the frequency of the RO signal if the adjusting signal is the third value (as described below). Most importantly, the DFM 101 does not "lock" the RO 103 once the desired multiplied frequency is reached, but continues to adjust the oscillation frequency of the RO 103 if required. Note that the power-up tree 107 and the clock tree 111 serve as buffers for the selection data and for the multiplied frequency, respectively, are known in the art, and are not described further herein.

Within the RO 103, an RO signal having a high voltage level (i.e., a high state) and a low voltage level (i.e., a low state) of approximately equal duration travels endlessly around a loop 143 formed by the RO 103's components 113, 117, 119, 125, 129 and 131. For example, when the RO signal is in a high state, the RO signal travels through the steering logic 113, through the coarse delay 117, through the fine delay 119, through the LSSD gating 125, through the bulk delay 129 and through the RO inverter 131 where it is inverted to a low state. The low state RO signal then similarly traverses the loop 143 and is inverted to a high state by the RO inverter 131. The high state RO signal then traverses the loop 143. This process repeats endlessly.

The travel time of a high state RO signal through the loop 143 (the time ($t_{ROH}$) the RO signal remains in the high state) and the travel time of a low state RO signal through the loop 143 (the time ($t_{ROL}$) the RO signal remains in the low state) set the period (T) and frequency (f) of the RO signal:

$$T = t_{ROH} + t_{ROL} \quad (1)$$

$$f = 1/T = 1/(t_{ROH} + t_{ROL}) \quad (2)$$

Accordingly, the shorter the travel times of the high and the low RO signals through the loop 143, the faster the frequency of the RO signal; and the longer the travel times of the high and the low RO signals through the loop 143, the slower the frequency of the RO signal. The delay of the coarse delay 117 and the delay of the fine delay 119 can be increased or decreased by the frequency adjuster 105 (described below) to adjust the travel times $t_{ROH}$ and $t_{ROL}$, and thus to adjust the frequency of the RO signal output by the RO 103 that serves as the multiplied frequency.

The details of the pertinent components within the DFM 101 now are described with reference to FIGS. 2–8. For convenience, only a small number of logic gates are shown for each component. It will be understood that an actual implementation may comprise more logic gates if desired.

Figure 2:
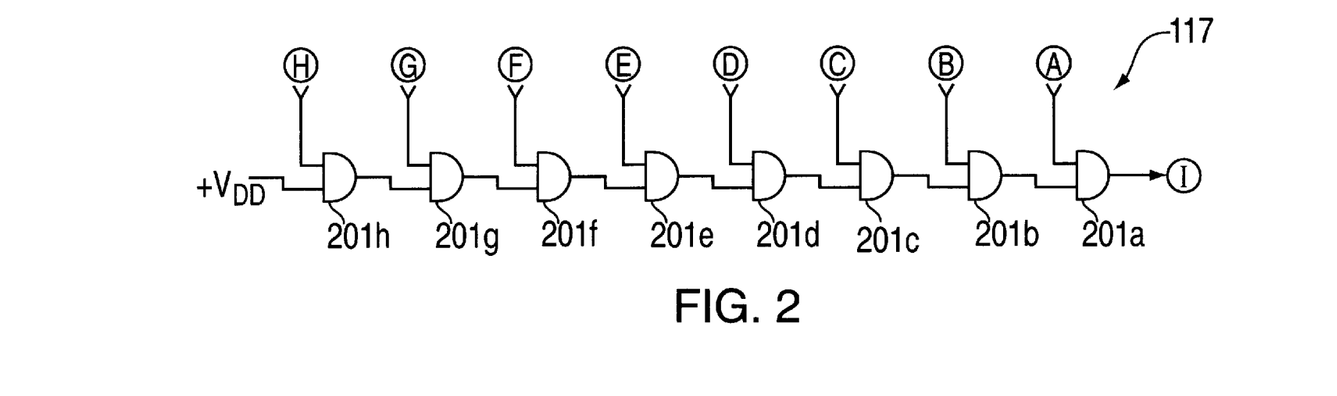
FIG. 2 is a schematic diagram of a first embodiment for the coarse delay of the inventive digital frequency multiplier of FIG. 1.

FIG. 2 is a schematic diagram of a first embodiment for the coarse delay 117 of the RO 103 of FIG. 1.

The coarse delay 117 comprises a plurality of series connected AND gates 201a–h. Each AND gate 201a–h has a first input terminal coupled to the steering logic 113 (not shown) of the RO 103 as indicated by the letters A–H. The second input of the eighth AND gate 201h is coupled to a positive voltage rail ($V_{DD}$), and the second input terminal of the AND gate 201*a–g* is coupled to the output terminal of the AND gate 201*b–h*, respectively (as shown). The output terminal of the first AND gate 201*a* is coupled to the fine delay 119 (not shown) of the RO 103 as indicated by the letter I.

In operation, assuming the first input terminal of each AND gate 201*a–h* is in a high state, the output of the first AND gate 201*a* will be high. Thereafter, the steering logic 113 (not shown) outputs a high state to the first input terminal of each AND gate 201*a–h* except for one to which the steering logic 113 outputs a low state.

The AND gate receiving the low state outputs a low state to its neighboring AND gate, and the low state eventually propagates to the output of the first AND gate 201*a*. A delay in switching the output state of the first AND gate 201*a* from high to low results, and the delay equals the total propagation delay through the AND gate receiving the low state, the first AND gate 201*a* and all AND gates therebetween. A similar delay results when switching the output state of the first AND gate 201*a* from the low state back to the high state. Accordingly, the steering logic 113 can select via the coarse delay 117 a delay of anywhere between the switching time of one AND gate (e.g., the first AND gate 201*a*) and the switching time of eight AND gates (e.g., the AND gates 201*a–h*) in increments of the switching time of one AND gate, depending on the AND gate to which the steering logic 113 outputs the low state.

Figure 3:
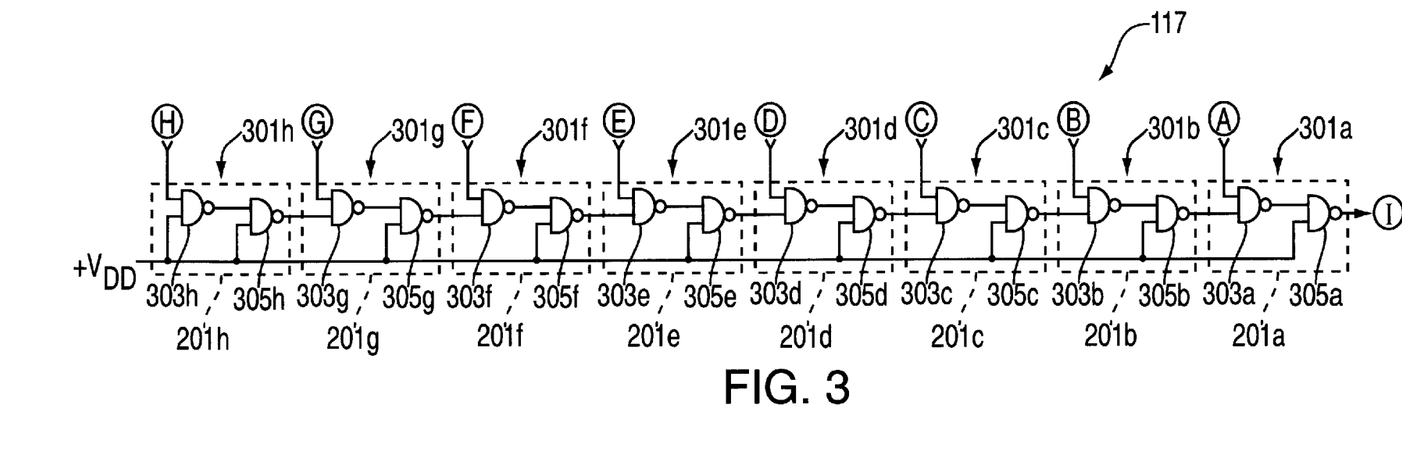
FIG. 3 is a schematic diagram of a second embodiment for the coarse delay of the inventive digital frequency multiplier of FIG. 1.

FIG. 3 is a schematic diagram of a second embodiment for the coarse delay 117 of the RO 103 of FIG. 1. The second embodiment for the coarse delay 117 is functionally identical to the first embodiment of FIG. 2. In the second embodiment of FIG. 3, each AND gate 201*a–h* is formed from a NAND gate pair 301*a–h*. Each NAND gate pair 301*a–h* comprises a first NAND gate 303*a–h* coupled to a second NAND gate 305*a–h*. The first input terminal of each first NAND gate 303*a–h* is coupled to the steering logic 113 (not shown) as indicated by the letters A–H. The second input terminal of the first NAND gate 303*h* is coupled to $V_{DD}$ and the second input terminal of the first NAND gate 303*a–g* is coupled to the output terminal of the second NAND gate 305*b–h*, respectively (as shown). The first input terminal of the second NAND gate 305*a–h* is coupled to the output terminal of the first NAND gate 303*a–h*, respectively. The second input terminal of each second NAND gate 305*a–h* is coupled to $V_{DD}$. The output terminal of the second NAND gate 305*a* is coupled to the fine delay 119 (not shown) as indicated by I. With use of the NAND gate pair embodiment of FIG. 3, the propagation delay of a high state and a low state RO signal through the AND gates 201*a–h* is nearly identical. Therefore, the duty cycle of the multiplied frequency output by the RO 103 is approximately 50%. The minimum delay resolution of the coarse delay 117 of FIG. 3 is the switching delay of a NAND pair (e.g., about 400 psec).

Figures 4, 5, 6:
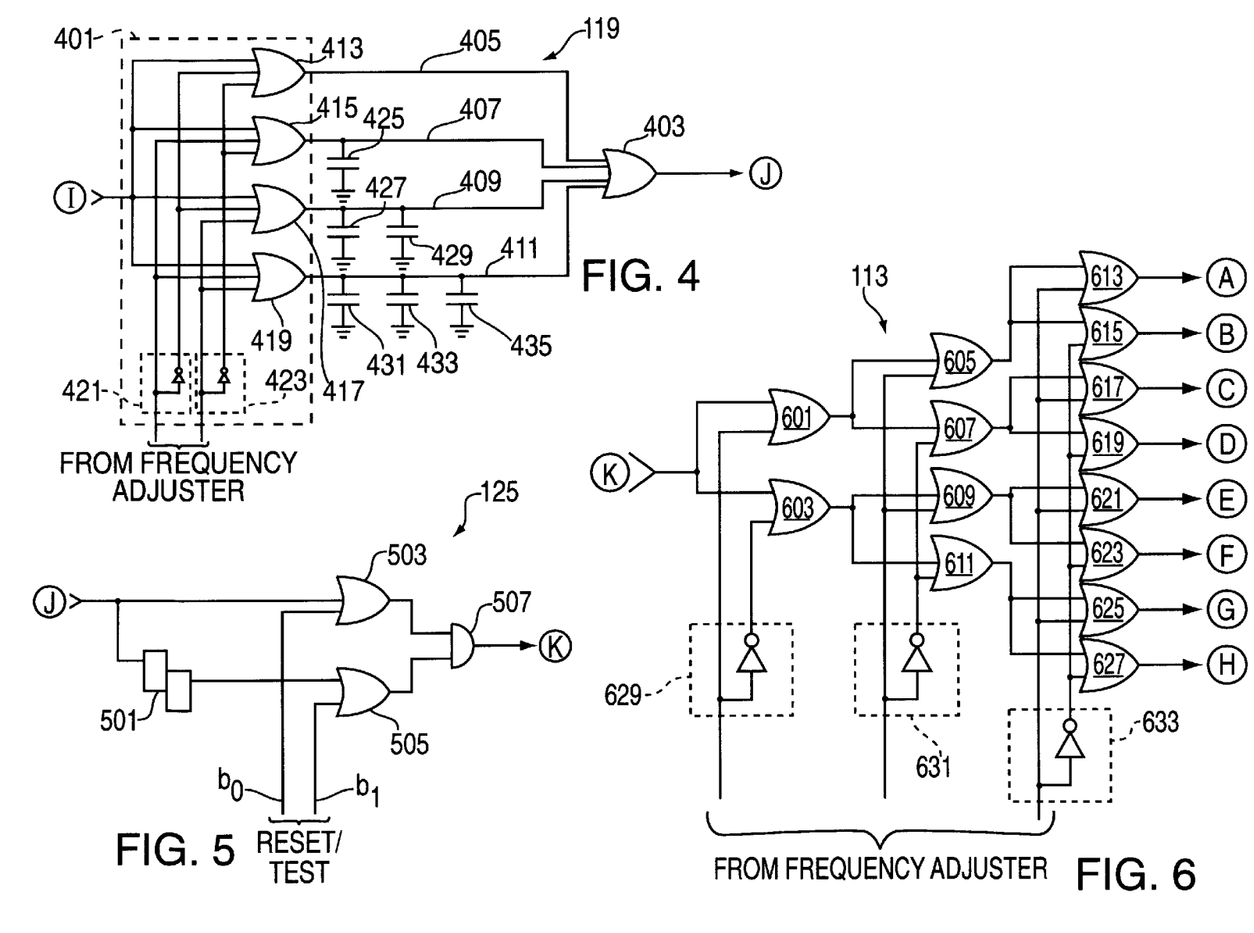
FIG. 4 is a schematic diagram of a fine delay for the inventive digital frequency multiplier of FIG. 1.
FIG. 5 is a schematic diagram of level sensitive scan design gating for the inventive digital frequency multiplier of FIG. 1.
FIG. 6 is a schematic diagram of steering logic for the inventive digital frequency multiplier of FIG. 1.

FIG. 4 is a schematic diagram of the fine delay 119 of the RO 103 of FIG. 1. The fine delay 119 comprises a delay selection circuit 401 coupled to a four-input OR gate 403 via a plurality of selectable delay paths 405–411. The delay selection circuit 401 comprises a plurality of fine delay AND gates 413–419, a first fine delay register 421 and a second fine delay register 423. A first input terminal of each AND gate 413–419 is coupled to the output of the coarse delay 117 as indicated by the letter I. The second input terminals of the first fine delay AND gate 413 and the third fine delay AND gate 417 are coupled to the inverting output terminal of the first fine delay register 421, and the second input terminals of the second fine delay AND gate 415 and the fourth fine delay AND gate 419 are coupled to non-inverting output terminal of the first fine delay register 421. The third input terminals of the first fine delay AND gate 413 and the second fine delay AND gate 415 are coupled to the inverting output terminal of the second fine delay register 423, and the third input terminals of the third fine delay AND gate 417 and the fourth fine delay AND gate 419 are coupled to the non-inverting output terminal of the second fine delay register 423. The input terminals of the first fine delay register 421 and the second fine delay register 423 are coupled to the frequency adjuster 105 via the second plurality of signal lines 121.

The first selectable delay path 405 contains no delay elements and is directly coupled between the output terminal of the first fine delay AND gate 413 and the first input terminal of the four-input OR gate 403. The second selectable delay path 407 contains a first delay element (e.g., a first capacitor 425 coupled between the second selectable delay path 407 and ground) and is coupled between the output terminal of the second fine delay AND gate 415 and the second input terminal of the four-input OR gate 403. If an RO signal travels through the second selectable delay path 407, the first capacitor 425 delays the signal by a smaller amount (e.g., about 100 psec) than the minimum delay of the coarse delay 117 (e.g., about 400 psec). The third selectable delay path 409 contains a second and a third delay element (e.g. a second capacitor 427 and a third capacitor 429 coupled between the third selectable delay path 409 and ground for a total delay of about 200 psec) and is coupled between the output terminal of the third fine delay AND gate 417 and the third input terminal of the four-input OR gate 403. The fourth selectable delay path 411 contains a fourth, a fifth and a sixth delay element (e.g., a fourth, a fifth and a sixth capacitor 431, 433, 435 coupled between the fourth selectable delay path 411 and ground for a total delay of about 300 psec) and is coupled between the output terminal of the fourth fine delay AND gate 419 and the fourth input terminal of the four-input OR gate 403. The four-input OR gate 403 outputs to the LSSD gating 125 any RO signal present on the first selectable delay path 405, the second selectable delay path 407, the third selectable delay path 409 or the fourth selectable delay path 411 as indicated by the letter J.

In operation, the RO signal travels from the coarse delay 117 to the fine delay 119. Once at the fine delay 119, the RO signal travels the path 405–411 selected by the frequency adjuster 105 via the delay selection circuit 401, is delayed thereby, and is output by the four-input OR gate 403 to the LSSD gating 125. The fine delay 119 thus adds an additional, finer delay to the RO signal if the second selectable delay path 407, the third selectable delay path 409 or the fourth selectable delay path 411 is selected. The fine delay registers 421, 423 also allow testing of the DFM 101 during operation (e.g., by monitoring or by pre-loading the registers 421, 423 in accordance with known LSSD techniques).

FIG. 5 is a schematic diagram of the LSSD gating 125 of the RO 103 of FIG. 1. The LSSD gating 125 comprises a first LSSD register 501, a first LSSD OR gate 503, a second LSSD OR gate 505 and an LSSD AND gate 507. The LSSD register 501 has an input terminal coupled to the output of the fine delay 119 (not shown) as indicated by the letter J and an output terminal coupled to the first input terminal of the second LSSD OR gate 505. The LSSD register 501 may be monitored or pre-loaded in accordance with known LSSD techniques.

The first LSSD OR gate 503 has a first input terminal coupled to the output of the fine delay 119 (not shown), a second input terminal for receiving a first bit $b_0$ of a RESET/TEST signal and an output terminal coupled to the first input terminal of the LSSD AND gate 507. The second LSSD OR gate 505 has a second input terminal for receiving a second bit $b_1$ of the RESET/TEST signal and an output terminal coupled to the second input terminal of the LSSD AND gate 507. The output terminal of the LSSD AND gate 507 is coupled to the steering logic 113 via the bulk delay 129 and the RO inverter 131 as indicated by the letter K.

In operation, the LSSD gating 125 operates in either a "pass" mode, a test mode or a reset mode selected by the first and the second RESET/TEST bits $b_0$, $b_1$, as shown in TABLE 1.

TABLE 1

| $b_0$ | $b_1$ | MODE OF OPERATION |
| --- | --- | --- |
| 0 | 0 | — |
| 0 | 1 | PASS |
| 1 | 0 | TEST |
| 1 | 1 | RESET |

In the pass mode, the second input terminal of the first LSSD OR gate 503 is forced low by the first RESET/TEST bit $b_0$ so that the first LSSD OR gate 503 passes the RO signal received from the fine delay 119; and the second input terminal of the LSSD AND gate 507 is forced high by the second RESET/TEST bit $b_1$ so that the LSSD AND gate 507 passes the RO signal from the first LSSD OR gate 503 to the steering logic 113 (not shown).

In the test mode, the second input terminal of the first LSSD OR gate 503 is forced high by the first RESET/TEST bit $b_0$ so that the first LSSD OR gate 503 does not pass the RO signal received by the fine delay 119. The RO signal thereby is forced through the LSSD register 501 where it is latched. The second input terminal of second LSSD OR gate 505 is forced low by the second RESET/TEST bit $b_1$ so that the second LSSD OR gate 505 passes the RO signal latched by (or loaded into) the LSSD register 501. The first input terminal of the LSSD AND gate 507 is forced high by the first RESET/TEST bit $b_0$ so that the LSSD AND gate 507 passes the RO signal from the second LSSD OR gate 505 to the steering logic 113 (not shown).

In the reset mode, both the second input terminal of the first LSSD OR gate 503 and the second input terminal of the second LSSD OR gate 505 are forced high by the first and the second RESET/TEST bits $b_0$, $b_1$, respectively. The RO signal from the fine delay 119 thereby is ignored by the first LSSD OR gate 503 and by the second LSSD OR gate 505, and the output of the LSSD AND gate 507 is forced high. The high state output by the LSSD AND gate 507 propagates through the RO 103 and resets the RO 103 by forcing all inputs of the coarse delay 117 high.

The RO signal travels out of the LSSD gating 125, through the bulk delay 129, and through the RO inverter 131 to the steering logic 113. The bulk delay 129 introduces an additional delay to the RO signal as it traverses the loop 143 of the RO 103. The bulk delay 129 may comprise any delay, but preferably comprises a plurality of inverters such that the net result of passing the RO signal through the bulk delay 129 and the RO inverter 131 is to invert the RO signal. The delay requirements of the bulk delay 129 are described below.

FIG. 6 is a schematic diagram of the steering logic 113 of the RO 103 of FIG. 1. The steering logic 113 comprises a plurality of steering logic OR gates 601–627 (e.g., an OR tree, although a NOR tree may be similarly employed) and a first, a second and a third steering logic register 629, 631, 633, respectively. The first input terminals of the first steering logic OR gate 601 and the second steering logic OR gate 603 are coupled to the output of the LSSD gating 125 via the bulk delay 129 and the RO inverter 131 as indicated by the letter K. The second input terminals of the first steering logic OR gate 601 and the second steering logic OR gate 603 are coupled to the non-inverting and to the inverting output terminals of the first steering logic register 629, respectively. The first input terminals of the third steering logic OR gate 605 and the fourth steering logic OR gate 607, and the first input terminals of the fifth steering logic OR gate 609 and the sixth steering logic OR gate 611, are coupled to the output terminals of the first steering logic OR gate 601 and the second steering logic OR gate 603, respectively. The second input terminals of the third steering logic OR gate 605 and the fifth steering logic OR gate 609, and the second input terminals of the fourth steering logic OR gate 607 and the sixth steering logic OR gate 611 are coupled to the non-inverting and to the inverting output terminals of the second steering logic register 631, respectively.

The first input terminals of the seventh steering logic OR gate 613 and the eighth steering logic OR gate 615, the first input terminals of the ninth steering logic OR gate 617 and the tenth steering logic OR gate 619, the first input terminals of the eleventh steering logic OR gate 621 and the twelfth steering logic OR gate 623, and the first input terminals of the thirteenth steering logic OR gate 625 and the fourteenth steering logic OR gate 627 are coupled to the output terminals of the third steering logic OR gate 605, the fourth steering logic OR gate 607, the fifth steering logic OR gate 609 and the sixth steering logic OR gate 611, respectively. The second input terminals of the seventh steering logic OR gate 613, the ninth steering logic OR gate 617, the eleventh steering logic OR gate 621 and the thirteenth steering logic OR gate 625, and the second input terminals of the eighth steering logic OR gate 615, the tenth steering logic OR gate 619, the twelfth steering logic OR gate 623 and the fourteenth steering logic OR gate 627, are coupled to the non-inverting and to the inverting output terminals of the third steering logic register 633, respectively.

The output terminals of the steering logic OR gates 613–627 are coupled to the first input terminals of the coarse delay 117's AND gates 201a–h, respectively, as indicated by the letters A–H. The input terminals of the first steering logic register 629, the second steering logic register 631 and the third steering logic register 633 are coupled to the frequency adjuster 105 via the first plurality of signal lines 115.

In operation, the steering logic 113 receives the RO signal from the RO inverter 131 and based on the selection data supplied by the frequency adjuster 105 to the steering logic registers 629–633 via the first plurality of signal lines 115, passes the RO signal to the first input terminal of one of the coarse delay AND gates 201a–h of the coarse delay 117. A high state is passed to the remaining coarse delay AND gates of the coarse delay 117.

The frequency adjuster 105 can selectively increase, decrease or maintain the delay of the coarse delay 117 by directing the RO signal to a particular coarse delay AND gate 201a–h. For example, if the frequency adjuster 105 outputs a low state to each input terminal of the first steering logic register 629, the second steering logic register 631 and the third steering logic register 633, the inverting output terminals of the registers 629, 631 and 633 force the output terminals of the second steering logic OR gate 603, the fourth steering logic OR gate 607, the sixth steering logic OR gate 611, the eighth steering logic OR gate 615, the tenth steering logic OR gate 619, the twelfth steering logic OR gate 623 and the fourteenth steering logic OR gate 627 to a high state. The output terminals of the ninth steering logic OR gate 617, the eleventh steering logic OR gate 621 and the thirteenth steering logic OR gate 625 thereby also are forced to a high state. The RO signal is free to pass to the first AND gate 201a of the coarse delay 117 via the first steering logic OR gate 601, the third steering logic OR gate 605 and the seventh steering logic OR gate 613. The RO signal may be similarly directed to any of the coarse delay AND gates 201a–h.

A significant advantage of the steering logic 113 lies in its growable structure. Specifically, if a larger number of coarse delay AND gates is required, repowering trees (e.g., buffers) may be added to the steering logic 113 without increasing an RO signal's travel time through the steering logic 113 due to the repowering trees. For example, if a repowering tree is required to drive the input terminals of the OR gates 613–627, the logic states of these input terminals will not change as rapidly as the logic states of the OR gates 601–611 due to the delay associated with the repowering tree. However, because the RO signal must first travel through one of the OR gates 601, 603 and through one of the OR gates 605–611 before reaching the OR gates 613–627, the logic states driven on the input terminals of the OR gates 613–627 are provided ample switching time prior to the arrival of the RO signal. Accordingly, the coarse delay 117 and the steering logic 113 may be easily expanded. The steering logic registers 629–633 also allow testing of the steering logic 113 (e.g., by monitoring or pre-loading the registers 629–633 in accordance with known LSSD techniques).

Figure 7:
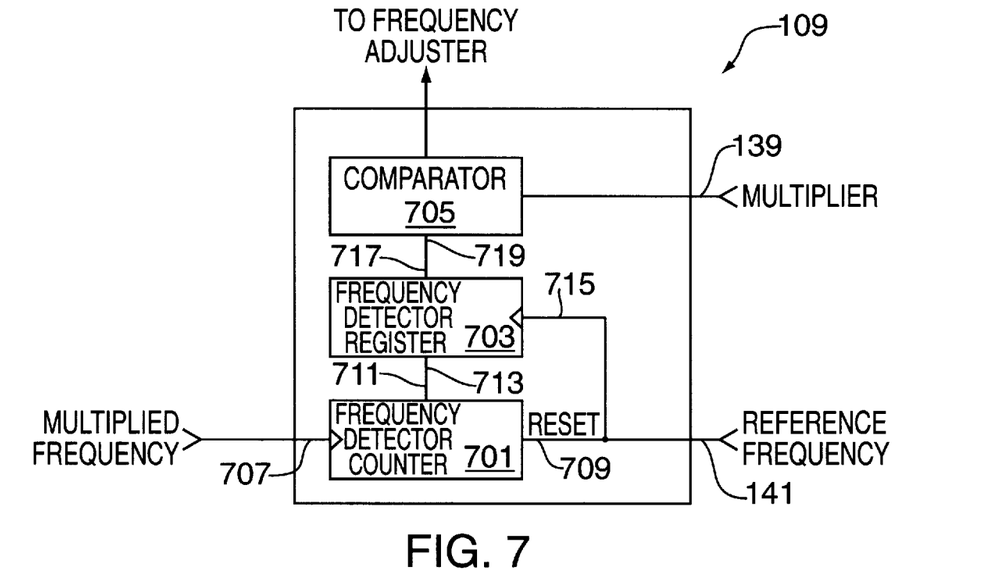
FIG. 7 is a schematic diagram of a frequency detector circuit for the inventive digital frequency multiplier of FIG. 1.

FIG. 7 is a schematic diagram of the frequency detector 109 of the DFM 101 of FIG. 1. The frequency detector 109 comprises a frequency detector counter 701, a frequency detector register 703 and a comparator 705. The frequency detector counter 701 comprises a clock input terminal 707 coupled to the RO output signal line 123 for receiving the RO signal from the fine delay 119, a RESET terminal 709 for receiving the reference frequency, and a count output terminal 711. The frequency detector register 703 comprises a data input terminal 713 coupled to the count output terminal 711 of the frequency detector counter 701, a clock input terminal 715 for receiving the reference frequency, and an output terminal 717. The comparator 705 comprises a first input terminal 719 coupled to the output terminal 717 of the frequency detector register 703 and a second input terminal (e.g., the multiplier terminal 139) for receiving the desired multiplier.

In operation, because the frequency detector counter 701 is clocked by the RO signal and is reset by the reference frequency, the frequency detector counter 701 counts the number of RO signal rising edges that occur between each reference frequency rising edge (i.e., the measured multiplier). Before the frequency detector counter 701 is reset, the measured multiplier is loaded from the counter 701 into the frequency detector register 703 (e.g., in response to a reference frequency rising edge that also resets the counter 701). The comparator 705 then compares the contents of the frequency detector register 703 to the desired multiplier supplied via the multiplier terminal 139, and generates an adjustment signal having a first value if the measured multiplier is less than the desired multiplier, a second value if the measured multiplier equals the desired multiplier and a third value if the measured multiplier is greater than the desired multiplier. The adjusting signal is output by the frequency detector 109 and is received by the input terminal 137 of the frequency adjuster 105. Thus, the difference between the reference frequency and the RO signal (e.g., the RO output frequency) is continuously monitored and the adjusting signal is continuously output.

Figure 8:
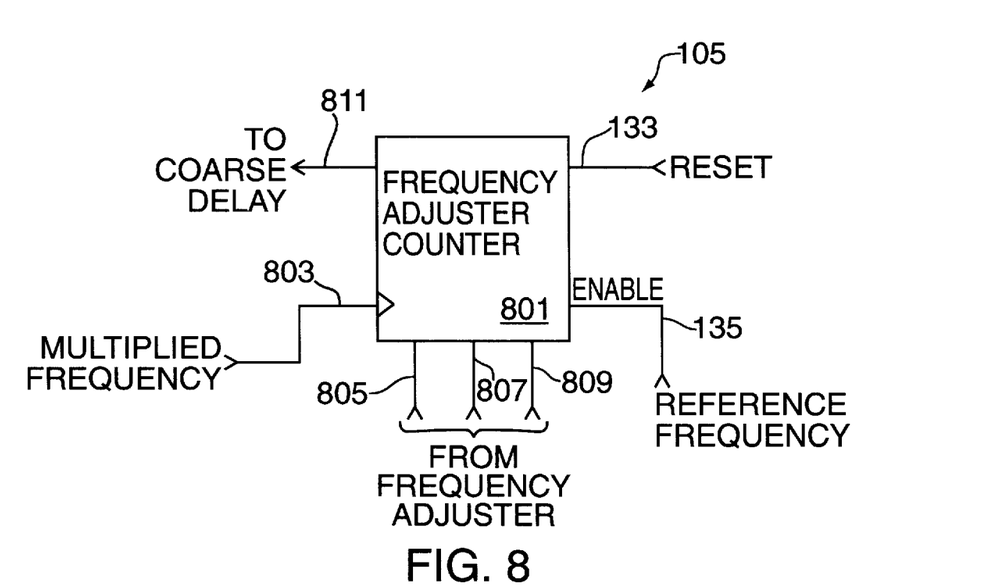
FIG. 8 is a schematic diagram of a frequency adjuster circuit for the inventive digital frequency multiplier of FIG. 1.

FIG. 8 is a schematic diagram of the frequency adjuster 105 of FIG. 1. The frequency adjuster 105 comprises in pertinent part a frequency adjuster counter 801. The frequency adjuster counter 801 comprises a clock input terminal 803 for receiving the RO signal, a reset terminal (e.g., the RESET terminal 133), an enable input terminal (e.g., the frequency adjuster reference frequency terminal 135), and an increase input terminal 805, a hold input terminal 807 and a decrease input terminal 809 coupled to the frequency detector 109 via the input terminal 137. An output terminal 811 of the counter 801 outputs the count of the counter 801 (as selection data) to the steering logic 113 and to the fine delay 119 as described below.

A decoder circuit (not shown) for selectively outputting a high logic state to one of the increase input terminal 805, the hold input terminal 807 and the decrease input terminal 809 based on the adjusting signal also is provided. Note that the frequency adjuster counter 801 only is enabled when a rising edge of the reference frequency is present on the counter's enable input terminal 135. When disabled, the frequency adjuster counter 801 "holds" or suspends its count until receipt of the next reference frequency rising edge.

In operation, the frequency adjuster counter 801 receives the adjusting signal from the frequency detector 109. If the adjusting signal has the first value, a high logic state is input to the increase input terminal 805 and a low logic state is input to the hold input terminal 807 and to the decrease input terminal 809. Accordingly, the frequency adjuster counter 801 increments its count the next time both the rising edge of the RO signal and the rising edge of the reference frequency are received. If the adjusting signal has the second value, a low logic state is input to the increase input terminal 805 and to the decrease input terminal 809 and a high logic state is input to the hold input terminal 807. The frequency adjuster counter 801, therefore, holds its count the next time both the rising edge of the RO signal and the rising edge of the reference frequency are received.

Likewise, if the adjusting signal has the third value, a low logic state is input to the increase input terminal 805 and to the hold input terminal 807 and a high logic state is input to the decrease input terminal 809. The frequency adjuster counter 801, therefore, decrements its count the next time both the rising edge of the RO signal and the rising edge of the reference frequency are received. Thus, the frequency adjuster counter 801 adjusts its count on every rising edge of the reference frequency if necessary.

In the exemplary DFM 101 of FIG. 1, the two least significant bits of the frequency adjuster counter 801's count are supplied to the fine delay 119 via the second plurality of signal lines 121, and the three most significant count bits are supplied to the steering logic 113 via the first plurality of signal lines 115. When the DFM 101 is first turned ON, the frequency adjuster counter 801 is pre-loaded with an initial count by supplying a RESET signal to the RESET terminal 133 (e.g., a middle count value, such as 64 for a 128 count counter). In this manner the RO 103 begins oscillating at its center oscillation frequency.

The bulk delay 129 preferably comprises logic circuitry that maintains the 50% duty cycle of the RO signal (e.g., pairs of NAND gates configured as inverters). The bulk delay 129's delay is selected to prevent the insertion of extraneous edges into the RO 103 from the selection data output by the frequency adjuster 105. For instance, assume $t_X$ is the time required for an RO signal rising edge to travel from the output of the fine delay 119 to the frequency adjuster 105, for the RO signal to clock the frequency adjuster 105, for the frequency adjuster counter 801 to adjust its count (e.g., assuming the frequency adjuster counter 801 is enabled by a rising edge of the reference frequency), and for the selection data output by the frequency adjuster 105 to reach the steering logic 113; and $t_Y$ is the time required for the RO signal rising edge to propagate from the output of the fine delay 119, through the LSSD gating 125, through the bulk delay 129, through the RO inverter 131 and to the steering logic 113.

Because the RO signal has a rising edge, during the time period $t_Y$, the input of the steering logic 113 is held at a high state. As such, all outputs of the steering logic 113 are forced to a high state, regardless of the logic states output by the steering logic registers 629–633. However, after the time period $t_Y$, the input of the steering logic 113 is switched to a low state (e.g., via the RO inverter 131), and the outputs of the registers 629–633 control which outputs of the steering logic 113 are high or low based on the selection data output by the frequency adjuster 105. Accordingly, to prevent the insertion of extraneous edges into the RO 103 (e.g., by changing the outputs of the registers 629–633 while the input of the steering logic 113 is low), the bulk delay 129's delay is selected so that $t_Y > t_X$. The outputs of the registers 629–633 of the steering logic 113 thereby are stable prior to switching the steering logic 113's input to a low state, and no extraneous edges are inserted into the RO 103.

The foregoing description discloses only the preferred embodiments of the invention, modifications of the above disclosed apparatus and method which fall within the scope of the invention will be readily apparent to those of ordinary skill in the art. For instance, the specific type of logic gates described herein are merely preferred and any functionally equivalent logic gates may be similarly employed (e.g., NOR rather than OR, a NAND tree or a NOR tree rather than an OR tree, etc.). Further, falling edge circuitry rather than rising edge circuitry (e.g., registers, counters, etc.) may be employed if desired.

Accordingly, while the present invention has been disclosed in connection with the preferred embodiments thereof, it should be understood that other embodiments may fall within the spirit and scope of the invention, as defined by the following claims.

The invention claimed is:

1. A digital frequency multiplier comprising:
   a frequency detector, coupled to a frequency adjuster, for receiving a reference frequency, a reference multiplier, and a ring oscillator ("RO") output frequency for continuously outputting to the frequency adjuster an adjusting signal based on a continuously monitored difference between the reference frequency and the output frequency;
   the frequency adjuster outputting selection data to an RO in response to the adjusting signal; and
   the RO including a plurality of selectable delay paths for determining the RO output frequency, one of which delay paths is selected by the RO in response to the selection data.

2. The multiplier of claim 1 wherein the RO includes a delay path selection means within each selectable delay path of the RO.

3. The multiplier of claim 1 wherein the RO further includes a circuit within each selectable delay path for placing the RO into a test mode and for initializing the RO.

4. The multiplier of claim 1 wherein the RO includes a plurality of storage devices for storing at least one of an RO signal traveling through the RO and the selection data output from the frequency adjuster so as to allow testing of the digital frequency multiplier's operation.

5. The multiplier of claim 1 wherein the RO includes growable RO circuitry for allowing the number of selectable delay paths within the RO to be increased without increasing an RO signal's travel time through the RO due to additional repowering circuitry.

6. A digital frequency multiplier comprising:
   a frequency detector for receiving a reference frequency, a reference multiplier and a ring oscillator (RO) output frequency, for continuously monitoring a difference between the reference frequency and the RO output frequency and for continuously outputting an adjusting signal based on the continuously monitored difference;
   a frequency adjuster coupled to the frequency detector, the frequency adjuster for receiving the adjusting signal from the frequency detector and for outputting selection data based on the received adjusting signal; and
   an RO coupled to the frequency detector and to the frequency adjuster and having a plurality of selectable delay paths, the RO for receiving the selection data output by the frequency adjuster, for selecting one of the delay paths in response to the received selection data and for outputting the RO output frequency with a frequency dependent on the selected delay path.

7. The digital frequency multiplier of claim 6 wherein the RO comprises:
   a coarse delay having a plurality of inputs and an output, the coarse delay for inputting an RO signal via one of the plurality of inputs and for outputting the RO signal via the output after a delay dependent on which input received the RO signal.

8. The digital frequency multiplier of claim 7 wherein the coarse delay comprises:
   a plurality of series-connected NAND gate pairs having a first end and a second end NAND gate pair, each NAND gate pair having a plurality of inputs and an output, wherein one of the plurality of inputs of each NAND gate pair comprises one of the plurality of inputs of the coarse delay and wherein an output of the second end NAND gate pair comprises the output of the coarse delay.

9. The digital frequency multiplier of claim 7 wherein the RO further comprises:
   steering logic coupled to the frequency adjuster and having a plurality of outputs coupled to the plurality of inputs of the coarse delay, the steering logic for receiving an RO signal, for receiving the selection data from the frequency adjuster and for outputting the received RO signal to one of the plurality of inputs of the coarse delay based on the received selection data.

10. The digital frequency multiplier of claim 9 wherein the steering logic further comprises:
    a logic circuit for steering the RO signal to one of the plurality of inputs of the coarse delay in response to the selection data, the logic circuit configured to reduce the delay in travel time of an RO signal through the logic circuit due to repowering circuitry coupled to the logic circuit.

11. The digital frequency multiplier of claim 10 wherein the logic circuit comprises a logic circuit selected from the group consisting of a NAND tree and a NOR tree.

12. The digital frequency multiplier of claim 9 wherein the steering logic comprises a plurality of registers for storing the selection data from the frequency adjuster.

13. The digital frequency multiplier of claim 6 wherein the RO comprises:
   a fine delay coupled to the frequency adjuster, the fine delay for receiving an RO signal, for receiving the selection data from the frequency adjuster and for outputting the received RO signal after a delay dependent on the selection data.

14. The digital frequency multiplier of claim 13 wherein the fine delay comprises:
   a plurality of selectable delay paths, each delay path having a different delay associated therewith, each delay path, when selected, for receiving an RO signal and for outputting the RO signal after the selected delay path's delay; and
   a selection mechanism coupled to the plurality of selectable delay paths and to the frequency adjuster, the selection mechanism for receiving the selection data from the frequency adjuster and for selecting based on the selection data one of the plurality of the selectable delay paths to receive an RO signal.

15. The digital frequency multiplier of claim 14 wherein the delay associated with each selectable delay path is a capacitive delay.

16. The digital frequency multiplier of claim 6 wherein the RO comprises:
   LSSD gating having a pass mode, a test mode and a reset mode, the LSSD gating for receiving an RO signal and for outputting the RO signal when in the pass mode, for storing the RO signal when in the test mode and for blocking the RO signal when in the reset mode.

17. The digital frequency multiplier of claim 16 wherein the LSSD gating comprises:
   a first path for receiving an RO signal;
   a second path for receiving the RO signal;
   a register coupled to the second path for storing the RO signal on the second path; and
   a gating mechanism coupled to the first and the second paths for passing the RO signal on the first path when the LSSD gating is in the pass mode, for passing the RO signal on the second path when the LSSD gating is in the test mode and for blocking the RO signal on both the first and the second paths when the LSSD gating is in the reset mode.

18. The digital frequency multiplier of claim 6 wherein the frequency detector comprises:
   a frequency detector counter for counting the number of rising edges of the RO output frequency that occur between each rising edge of the reference frequency so as to produce a measured multiplier; and
   a comparator for comparing the measured multiplier to the reference multiplier and for outputting the adjusting signal with a first value if the measured multiplier is less than the reference multiplier, with a second value if the measured multiplier equals the reference multiplier and with a third value if the measured multiplier is greater than the reference multiplier.

19. The digital frequency multiplier of claim 16 wherein the frequency adjuster comprises a frequency adjuster counter having an input and an output, the input for receiving the adjusting signal from the frequency detector and for incrementing a count of the frequency adjuster counter when the adjusting signal has a first value, for holding the count of the frequency adjuster counter when the adjusting signal has a second value and for decrementing the count of the frequency adjuster counter when the adjusting signal has a third value, the output of the frequency adjuster for outputting the count of the frequency adjuster counter as selection data.

20. The digital frequency multiplier of claim 19 wherein the frequency adjuster counter further comprises a reset input for resetting the count of the frequency adjuster counter to a predetermined value in response to a reset signal.

21. A digital frequency multiplier comprising:
   a frequency detector means for receiving a reference frequency, a reference multiplier and a ring oscillator (RO) output frequency, for continuously monitoring a difference between the reference frequency and the RO output frequency and for continuously outputting an adjusting signal based on the continuously monitored difference;
   a frequency adjuster means coupled to the frequency detector means, the frequency adjuster means for receiving the adjusting signal from the frequency detector means and for outputting selection data based on the received adjusting signal; and
   an RO means coupled to the frequency detector means and to the frequency adjuster means, the RO means for generating an RO signal, the RO means comprising:
      a coarse delay means for delaying the RO signal by a first delay;
      a fine delay means coupled to the coarse delay means and to the frequency adjuster means for receiving the RO signal from the coarse delay means, for receiving the selection data from the frequency adjuster means, for delaying the RO signal by a second delay determined by the selection data and for outputting the RO signal to the frequency adjuster means as the RO output frequency;
      LSSD gating means coupled to the fine delay means and having a pass mode, a test mode and a reset mode, the LSSD gating means for receiving the RO signal from the fine delay means and for passing the RO signal when in the pass mode, for storing the RO signal when in the test mode and for blocking the RO signal when in the reset mode;
      a bulk delay means coupled to the LSSD gating means for receiving the RO signal from the LSSD gating means and for delaying the RO signal by a third delay; and
      steering logic means coupled to the coarse delay means, to the frequency adjuster means and to the bulk delay means for receiving the RO signal from the bulk delay means, for receiving the selection data from the frequency adjuster means and for adjusting the first delay of the coarse delay means based on the selection data.

22. The digital frequency multiplier of claim 21 wherein the frequency adjuster means comprises a counter clocked by the RO signal; and
   wherein the bulk delay means comprises a circuit which delays the RO signal as it travels from the LSSD gating to the steering logic means a time sufficient for the RO signal to travel from the fine delay means to the frequency adjuster means, for the RO signal to clock the counter of the frequency adjuster means, and for the frequency adjuster means to output selection data from the counter before the RO signal reaches the steering logic means.

23. A method of digitally multiplying a reference frequency comprising:
   providing a reference frequency;

providing a reference multiplier;
generating a multiplied frequency;
continuously comparing the multiplied frequency to the reference frequency so as to generate a measured multiplier equaling the multiplied frequency divided by the reference frequency;
comparing the measured multiplier with the reference multiplier, and:

increasing the multiplied frequency if the measured multiplier is less than the reference multiplier;
maintaining the multiplied frequency if the measured multiplier equals the reference multiplier; or
decreasing the multiplied frequency if the measured multiplier is greater than the reference multiplier.

* * * * *